(12) United States Patent
Schmitt

(10) Patent No.: US 8,581,643 B1
(45) Date of Patent: Nov. 12, 2013

(54) PHASE-LOCK LOOP-BASED CLOCKING SYSTEM, METHODS AND APPARATUS

(75) Inventor: Joseph M. Schmitt, Andover, MA (US)

(73) Assignee: Lightlab Imaging, Inc., Westford, MA (US)

( * ) Notice: Subject to any disclaimer, the term of this patent is extended or adjusted under 35 U.S.C. 154(b) by 0 days.

(21) Appl. No.: 13/284,122

(22) Filed: Oct. 28, 2011

(51) Int. Cl.
H03L 7/06 (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| | | | | |
|---|---|---|---|---|
| 4,630,188 A * | 12/1986 | Daggett | ......................... | 363/129 |
| 5,050,146 A * | 9/1991 | Richgels et al. | ............ | 369/30.15 |
| 5,254,955 A * | 10/1993 | Saeki et al. | ..................... | 327/156 |
| 7,061,622 B2 | 6/2006 | Rollins et al. | | |
| 7,599,678 B2 * | 10/2009 | Fisher | ............................ | 455/323 |
| 7,787,852 B2 * | 8/2010 | Rofougaran | ................... | 455/313 |
| 7,936,462 B2 | 5/2011 | Jiyang et al. | | |
| 8,049,900 B2 | 11/2011 | Kemp et al. | | |
| 8,139,226 B2 | 3/2012 | Johnson | | |
| 8,325,419 B2 | 12/2012 | Schmitt | | |
| 2003/0025914 A1 * | 2/2003 | Demarest | ...................... | 356/500 |
| 2005/0127964 A1 * | 6/2005 | Lee | ................ | 327/158 |
| 2005/0134337 A1 * | 6/2005 | Lee et al. | ...................... | 327/158 |
| 2005/0254060 A1 * | 11/2005 | Alphonse | ...................... | 356/479 |
| 2005/0254061 A1 * | 11/2005 | Alphonse | ...................... | 356/479 |
| 2006/0132790 A1 | 6/2006 | Gutin | | |
| 2008/0130384 A1 * | 6/2008 | Choi | ............................. | 365/194 |
| 2008/0165366 A1 * | 7/2008 | Schmitt | ......................... | 356/519 |
| 2009/0046295 A1 * | 2/2009 | Kemp et al. | .................... | 356/479 |
| 2011/0080104 A1 * | 4/2011 | Gray et al. | ..................... | 315/246 |
| 2011/0080580 A1 | 4/2011 | Fermann et al. | | |
| 2011/0101207 A1 | 5/2011 | Schmitt et al. | | |
| 2011/0234978 A1 * | 9/2011 | Hammer et al. | ............... | 351/208 |
| 2012/0013914 A1 * | 1/2012 | Kemp et al. | ................... | 356/479 |
| 2012/0310081 A1 | 12/2012 | Adler et al. | | |
| 2013/0044330 A1 * | 2/2013 | Kang et al. | ..................... | 356/479 |

OTHER PUBLICATIONS

Kariya et al., "Analog CMOS Circuit Design and Characterization for Optical coherence Tomography signal Processing", IEEE Transactions on Biomedical Engineering, 51:12, pp. 2160-2163, Dec. 2000.
Pending U.S. Appl. No. 13/195,234, filed Aug. 1, 2011, in the name of Joseph M. Schmitt.

* cited by examiner

Primary Examiner — Adam Houston
(74) Attorney, Agent, or Firm — K&L Gates LLP

(57) ABSTRACT

In part, the invention relates to an optical coherence tomography system that includes one or more phased-locked loop circuits. In one embodiment, the phased-locked loop circuit includes a phase detector, a loop filter, and a voltage controlled oscillator wherein the phased-locked loop circuit is configured to generate a sample clock. The optical coherence tomography system can include an analog to digital converter having a sample clock input, an interferometric signal input, and a sample data output, the analog to digital converter configured to receive the sample clock and sample OCT data in response thereto. In one embodiment, the phased-locked loop circuit is configured to lock on a first signal in less than or equal to about 1 microseconds.

20 Claims, 8 Drawing Sheets

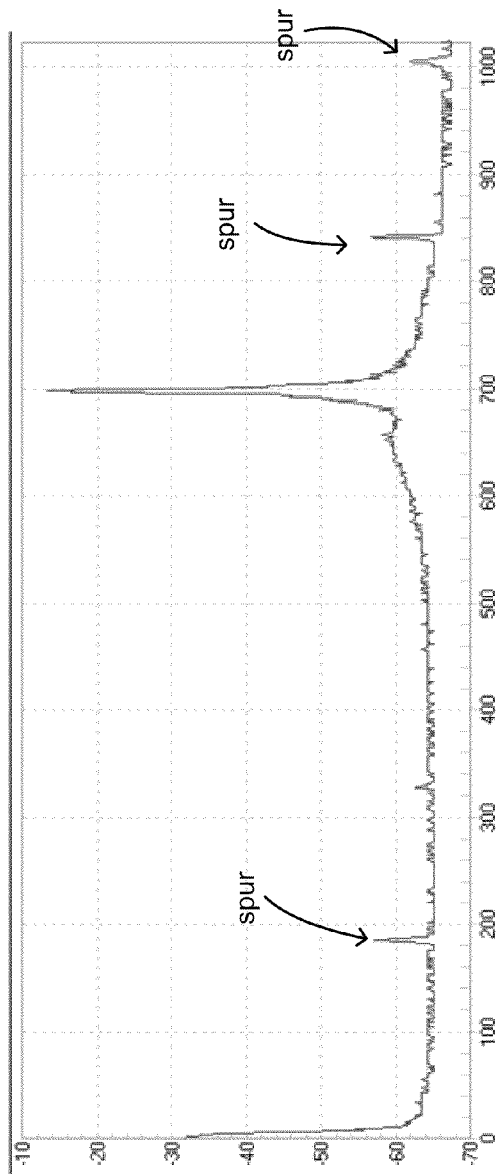
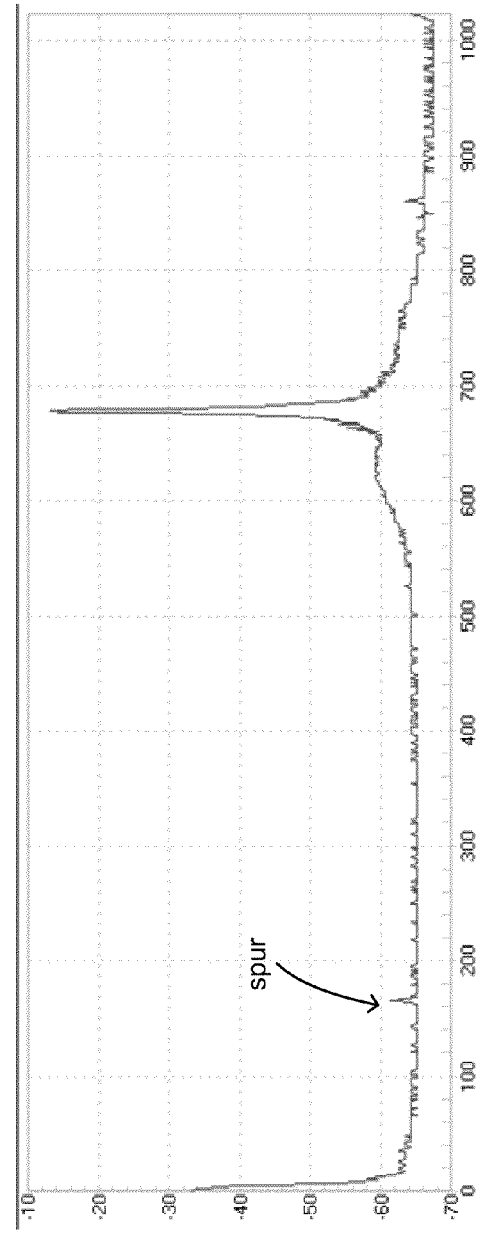

PHASE-LOCK LOOP-BASED CLOCKING SYSTEM, METHODS AND APPARATUS

FIELD OF INVENTION

In part, the invention generally relates to devices and methods suitable for synchronizing devices or otherwise generating clock signals or related signals in a data collection or data processing system such as optical coherence tomography systems.

BACKGROUND

Various types of imaging modalities such as ultrasound, magnetic resonance imaging, optical coherence tomography (OCT) and others require different signals to be synchronized. This is achieved using various tracking and clocking techniques and devices. If the relevant signals are not properly synchronized, data and the images formed from such data can have a high noise component. Further, in the case of interferometer based modalities, no sample data is generated if interference does not occur, which can result when sweeps of the optical source and other data collection events are not synchronized.

With respect to OCT, an optical source is used in conjunction with a probe and an interferometer to obtain optical data with respect to a sample. Such data is compared with a reference signal to generate interference using the interferometer and the relative lengths of various optical paths. The optical source can be a tunable light source such as a tunable laser. A tunable laser and others can be used when operating a frequency domain OCT system. The optical frequency of the tunable light source can change over time, by for example, being swept over a range of wavelengths or frequencies. These changing frequencies require the synchronization of data collection with other system components.

A signal, such as a clock or clock signal, can be used to trigger OCT interference data acquisition. Generating a suitable clock can be performed using a clock generator. Given the complexity of the OCT systems, errors associated with the clock can result in jitter, noise, and other undesirable effects. Therefore, a need exists to reduce or compensate for such undesirable effects and improve upon clock generators and other system components and signals relating thereto. The embodiments of the invention address this need and others.

SUMMARY

In one aspect, the invention relates to control systems, circuits, arrangements of one or more circuit elements, integrated circuits (IC) such as application specific integrated circuits (ASICS) and for example, complementary metal-oxide-semiconductor (CMOS) devices and integrated circuits, and other devices and device-based process steps that use a phase-locked loop (PLL) to generate a clock, such as a k-clock or sample clock. With respect to the "k-clock", "k" refers to the commonly-used symbol for optical frequency. In one aspect, the invention relates to performing a frequency multiplication of a signal to generate a suitable clock signal using a phase-locked loop. In turn, the suitable clock signal can be can be used to trigger the OCT interference data acquisition in an OCT system. In one embodiment, the clock generator includes a phase-locked loop. In another embodiment, the clock generator also includes one or more noise or error compensating subsystems or circuits.

In another aspect, the invention relates to electronic frequency multiplication techniques for clocking optical sources and/or electrical components or subsystems configured to meet requirements for discontinuous operation, wide voltage-controlled oscillator (VCO) bandwidth, and fast turn-on characteristics that are not satisfied by certain conventional PLL designs. Other techniques for frequency multiplication of a signal, such as a raw k-clock or a precursor clock signal, are described herein.

In one aspect, the invention relates to adapting PLL technology to high-speed clocking. Further, another embodiment of the invention relates to using complementary metal-oxide-semiconductor (CMOS) devices and integrated circuits that incorporate wide-bandwidth VCOs that are configured to provide a clock signal for an OCT system.

In one aspect, the invention relates to using a phase-locked loop to reduce noise in a clock signal for swept source light sources including Fourier Domain Mode Locked (FDML) lasers.

In one aspect, the invention relates to an optical coherence tomography system that includes a control system. In one embodiment, the control system includes a zero-crossing detector, a first phased-locked loop circuit and an analog to digital converter. In one embodiment, the zero-crossing detector has a first input and a first output, the first input configured to receive a first input signal. In one embodiment, the first phased-locked loop circuit having a second input and a second output; the second input being in electrical communication with the first output. In one embodiment, the first phase-locked loop circuit and is configured to generate a sample clock. In one embodiment, the first phase-locked loop circuit includes a phase detector in electrical communication with the second input, a loop filter in electrical communication with the phase detector, the loop filter including a reference signal input configured to receive a reference control signal, and a voltage controlled oscillator in electrical communication with the loop filter and the second output. In one embodiment, the analog to digital converter is configured to receive the sample clock and sample OCT data in response thereto and includes a sample clock input, an interferometric signal input, and a sample data output, the analog to digital converter.

In another embodiment, the phased-locked loop circuit is configured to lock on a first signal received at the second input in less than or equal to about 1 microsecond. In one embodiment, the first input signal has a frequency and a mean frequency. In another embodiment, the loop filter includes a first diode and a second diode configured to automatically block current flow during a first frequency state. In yet another embodiment, the voltage controlled oscillator is configured to have a bandwidth that ranges from a high frequency to a low frequency such that the ratio of the high frequency to the low frequency is greater than or equal to about 2:1. In still yet another embodiment, the phase-locked loop is configured such that it can transmit or lock on frequencies greater than or equal to about 20 MHz.

In one embodiment, the voltage controlled oscillator is configured to have a response time of less than about 100 ns. The first frequency state can be when the frequency is within a specified band of frequencies centered on the mean frequency. In another embodiment the loop filter includes a RC circuit or a RLC circuit in electrical communication with ground. In yet another embodiment the control system also includes a second phase locked loop configured to generate the reference control signal. In still yet another embodiment, the loop filter has a time constant that ranges from about 20 ns to about 80 ns. Further, in one embodiment the phase-locked loop is configured to multiply the input signal N times wherein N is a positive integer that ranges from 1 to 16.

In another aspect, the invention relates to an optical coherence tomography system having a control system. In one embodiment, the control system includes a zero-crossing detector, a phase-locked loop circuit a voltage controlled oscillator and an analog to digital converter. In one embodiment, the zero-crossing detector has a first input and a first output, the first input configured to receive a first input signal. In one embodiment, the phased-locked loop circuit is configured to generate a sample clock and has a second input and a second output wherein the second input is in electrical communication with the first output. The phase-locked loop includes a phase detector in electrical communication with the second input, the phase detector includes a reference input and a phase error signal output, a phase error compensator in electrical communication with the phase error signal output and comprising a phase error compensator output and a sweep trigger signal input, and a voltage controlled oscillator in electrical communication with the phase error compensator output and the second output. The voltage controlled oscillator has a VCO frequency. The analog to digital converter includes a sample clock input, an interferometric signal input, and a sample data output, the analog to digital converter configured to receive the sample clock and sample OCT data in response thereto.

In still another aspect, the invention relates to method of clocking an analog to digital converter configured to sample optical coherence data from a main interferometer in an optical coherence tomography system. The method, in one embodiment, includes receiving a first clock signal having a first phase at a first input to a phase-locked loop; locking on or tracking the first clock signal within a first time period; detecting the first phase of the first clock signal; frequency multiplying the first clock signal or a signal derived therefrom by N using an oscillator to generate a sample clock; and clocking an analog to digital converter in electrical communication with a photoreceiver in optical communication with an interferometer configured to collect OCT data. In one embodiment, the first time period is less than or equal to about 1 microsecond. In another embodiment, the method further includes the step of filtering the first clock signal using a loop filter having a control signal input. In still another embodiment, the method further includes the step of presetting a reference voltage level of the loop filter by applying a control signal to the control signal input. In still yet another embodiment, the method further includes the step of varying the control signal in response to a sweep trigger signal, a phase-locked loop originated signal, or a signal correlated with one of the two foregoing signals. In one embodiment, the method further includes the step of compensating for feedthrough noise by filtering the first clock signal using a loop filter comprising a RLC or RC circuit. In another embodiment, the method further includes the step of compensating for phase error prior to generating the sample clock by controlling the oscillator using a control signal correlated with a sweep trigger signal of an optical source used in the OCT system. In another embodiment, the PLL can be implemented using various circuit elements alone or in combination with integrated circuits.

Yet another aspect of the invention is a clocking system that includes a zero-crossing detector and a phase-locked loop circuit, the phase-locked loop circuit configured to generate a clock signal. In one embodiment, the zero-crossing detector has a first input and a first output, the first input configured to receive a first input signal. In one embodiment, the phased-locked loop circuit has a second input and a second output wherein the second input is in electrical communication with the first output and a phase detector in electrical communication with the second input, the phase detector comprising a reference input and a phase error signal output, a phase error compensator in electrical communication with the phase error signal output and comprising a phase error compensator output and a sweep trigger signal input, and a voltage controlled oscillator in electrical communication with the phase error compensator output and the second output.

Still yet another aspect of the invention is a method of generating a clock signal. In one embodiment, the method includes the steps of receiving a first clock signal having a first phase at a first input to a phase-locked loop; locking on the first clock signal within a first time period; detecting the first phase of the first clock signal; and frequency multiplying the first clock signal or a signal derived therefrom by N using an oscillator to generate a clock signal. In one embodiment, N is a positive integer that ranges from 1 to 16.

This Summary is provided merely to introduce certain concepts and not to identify any key or essential features of the claimed subject matter.

BRIEF DESCRIPTION OF FIGURES

The figures are not necessarily to scale, emphasis instead generally being placed upon illustrative principles. The figures are to be considered illustrative in all aspects and are not intended to limit the invention, the scope of which is defined only by the claims.

FIG. 8 shows an OCT signal from a single reflector without spur compensation activated, in accordance with an illustrative embodiment of the invention.

FIG. 9 shows an OCT signal from a single reflector with spur compensation activated, in accordance with an illustrative embodiment of the invention.

DETAILED DESCRIPTION

Figure 1A:
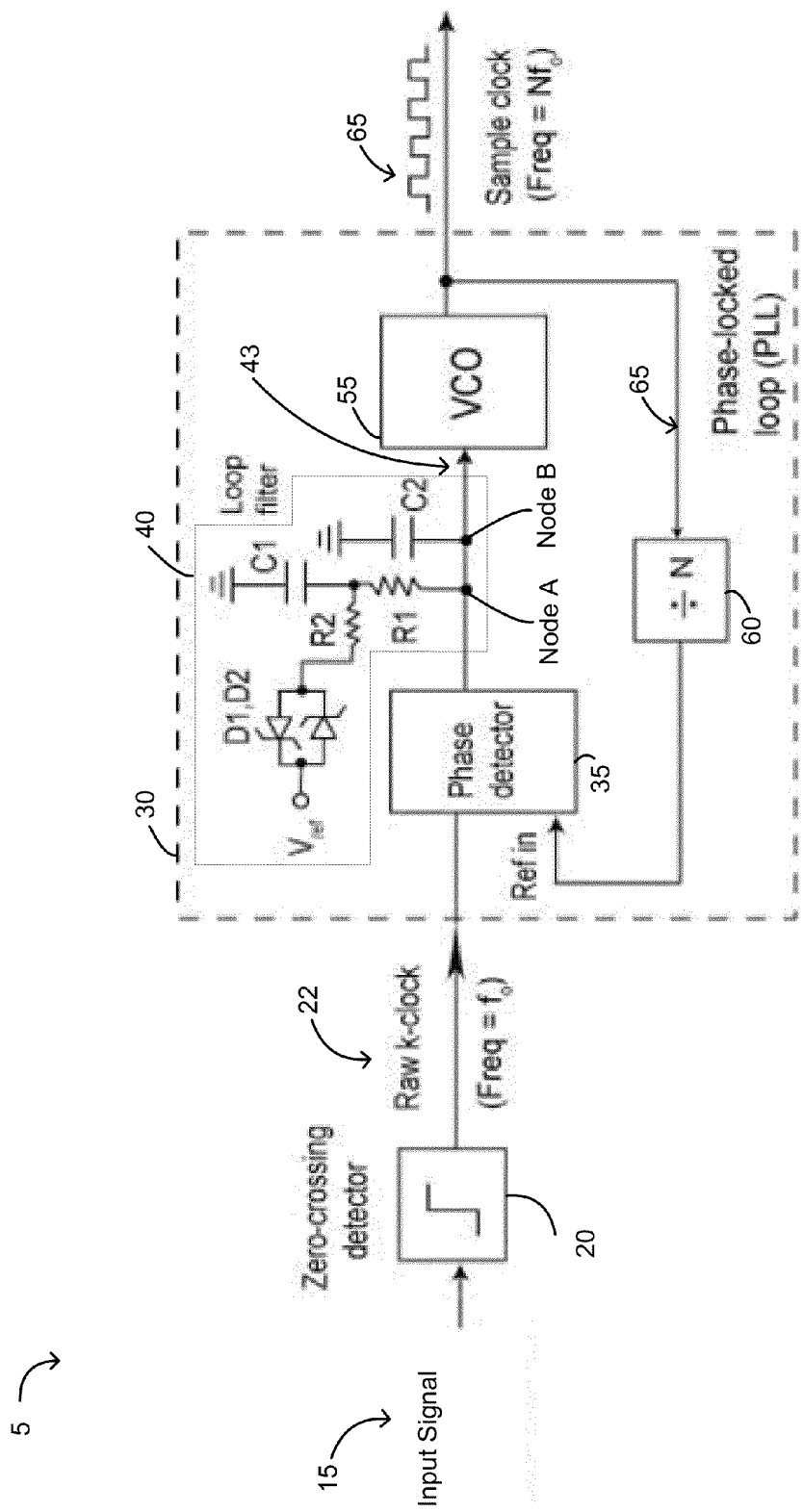
FIG. 1A shows a phase-locked loop-based system configured to generate a clock signal suitable for use in an OCT system in accordance with an illustrative embodiment of the invention.

Swept-source OCT systems (also called frequency-domain or scanning-laser OCT systems) are complex systems that include multiple electrical and optical signals as inputs and outputs. For example, OCT systems can include optical sources, electro-optical converters, interferometers, couplers, probes, clock generators, and other components. The transmission and receipt of optical and electrical elements between such components, as applicable, can result in unwanted noise, jitter, phase changes and other effects. In part, embodiments of the invention employ one or more phase-locked loops (PLLs) to address some of the issues relating to signal clocking and synchronization.

Specifically, synchronizing data collection and operation of the optical source has particular challenges in OCT. Synchronizing the analog-to-digital conversion of the OCT data signal with the instantaneous optical frequency of the tunable light source using a typical clock generator can lead to unwanted effects. These unwanted effects, such as noise and phase deviations can be compensated for or prevented as described below. In one embodiment, this synchronization can be performed by converting a signal, such as the output of a secondary interferometer, into an electronic pulse train. This pulse train or precursor clock signal, also referred to herein as the 'raw' (i.e., pre-processed) k-clock signal or as the k-clock signal, can be used as the sample clock of a high-speed analog-to-digital converter (ADC). This high speed ADC is used to control sampling of a primary interferometer. As outlined in more detail below, it is preferable to process the k-clock signal to generate a sample clock.

The k-clock can serve as a sample clock if it connects directly to the sample clock input of an ADC, but it can also be connected to a second input of an ADC clocked by a fixed-frequency clock such as a crystal oscillator. In such embodiments, the frequency of the ADC sample clock varies with the instantaneous tuning speed of the optical source. In one embodiment, where the ADC is clocked with a fixed-frequency clock (from, for example, a crystal oscillator), the raw k-clock can be read by a second ADC converter and stored as a digital array. The OCT signal of interference fringes and the raw k-clock can then be synchronized by using a software interpolation routine. This approach adds additional cost, complexity, and time delays to an OCT system's design.

Because of its simplicity and ability to operate at very high scanning speeds, direct variable-frequency electronic clocking using a k-clock is preferred over software-based data interpolation. Notwithstanding its benefits, the k-clock indicates when the tunable laser sweeps through equally spaced optical frequencies. Thus, the k-clock is tied to the operation of the laser and not specifically designed for sampling OCT data. As a result, direct variable-frequency electronic clocking is susceptible to excess noise generated by the light source during scanning that causes the raw k-clock to exhibit phase jitter. In turn, this jitter leads to degradation of OCT resolution and dynamic range. Especially troublesome is the phase jitter of k-clocks derived from light sources with dynamic coherence lengths less than twice the round-trip scanning depth.

In light of the foregoing, it is clear that there are advantages to using a clock signal tailored specifically for sampling OCT data. In contrast with the raw k-clock or k-clock, that are linked to a tunable laser's sweep pattern, operational parameters and noise characteristics, preferably, a sample clock is configured relative to the operation of the ADC sampling the OCT data and processed to remove noise, jitter or other undesirable artifacts. Thus, once generated, the edges of the sample clock indicate to the ADC when to sample an analog signal at the ADC input that contains OCT data. One method for creating such a sample clock uses a raw k-clock signal as the basis for generating the sample clock by tracking the phase of the raw k-clock and multiplying its frequency. In one embodiment, the sample clock is derived from a signal originating from a secondary interferometer. In turn, in response to an edge of a sample clock, the ADC samples interference signals at an output of a main or primary interferometer. These features are described in more detail herein.

In part, the invention relates to methods, devices, and subsystems configured to mitigate noise problems encountered in swept-source optical coherence tomography (OCT) systems. These features and others of the invention are similar for use with OCT systems in which synchronization between the optical frequency of a laser and the acquisition of OCT fringe signals is performed by an electronic clocking device or system. In one embodiment, the clocking is performed using direct variable-frequency electronic clocking of an analog-to-digital converter. Electronic circuits, systems, and methods are described herein that incorporate phase-locked loops that are selected or designed to satisfy certain criteria and/or possess certain parameters configured for noise mitigation, signal multiples, clocks, phase jitter sensitivity and other features.

In addition, the invention relates to system, circuit element, filter and phase-locked loop configurations, either alone or in combination, that are configured to reduce a frequency-multiplying k-clock generator's sensitivity to phase jitter of the raw k-clock. In one embodiment, the PLLs and/or related system elements (or methods steps) are configured (or performed) such that electronic frequency multiplication and reduction of phase jitter are achieved simultaneously.

Some embodiments of the invention also correct or reduce optical dispersion effects in the OCT system. Specifically, some embodiments of the invention are configured to compensate for optical coherence tomography signal dispersion by electronically adjusting the k-clock generator. These and other features of the invention are described in more detail herein.

Phase Lock Loop System Embodiments and Related Features

FIGS. 1A, 2, 3 and 4 depict different PLL clocking systems configured for use with an optical source such as a swept frequency laser suitable for use in a frequency domain OCT system. In one embodiment, the laser has discontinuous sweeps. These systems and others described herein can be used as a control system for an OCT system or one or more components or subsystems thereof. Each of these systems is configured to receive an input signal and lock on (or track) the signal within a signal locking period (or tracking period). The signal can be originated and/or correlated with or derived from the analog light-based signal emitted from the optical source or received from a secondary interferometer. In one embodiment, the signal locking period or tracking period is less than or equal to about 0.8 microseconds. Each of these systems includes one or more phase-locked loops having similar or different configurations. For example, the systems may differ based on the circuit elements or combination of circuit elements in electrical communication with a given phase-locked loop. Each of the embodiments shown in FIGS. 1A, 2, 3 and 4 includes a voltage-controlled oscillator (VCO), but other oscillators suitable for locking to or tracking a reference signal can be used in various embodiments.

As a general overview, a PLL is a type of control system that generates an output signal that tracks, matches or relates to the phase of an input reference signal such as a raw clock signal, interferometer generated or derived signal or other suitable input signal. An oscillator, such as a VCO, is controlled such that a signal generated by the oscillator tracks or locks on an edge of the input signal, such as the sample clock, for a period of time. The VCO locks on the input signal frequency or a multiple of it.

To lock on a multiple of an input signal frequency, the VCO frequency is divided by an integer number before the phases of the input signal and VCO signal are compared by the phase detector. The phase detector generates a voltage or current proportional to the phase difference between the input signal and the divided-down VCO signal. A phase detector is used to control the VCO and maintain the desired phase relationship between the input signal and the output signal produced by the VCO. The systems described below incorporate PLLs having VCOs that lock on or track a clock signal or a multiple thereof and generate a sample clock as an output.

Figure 1B:
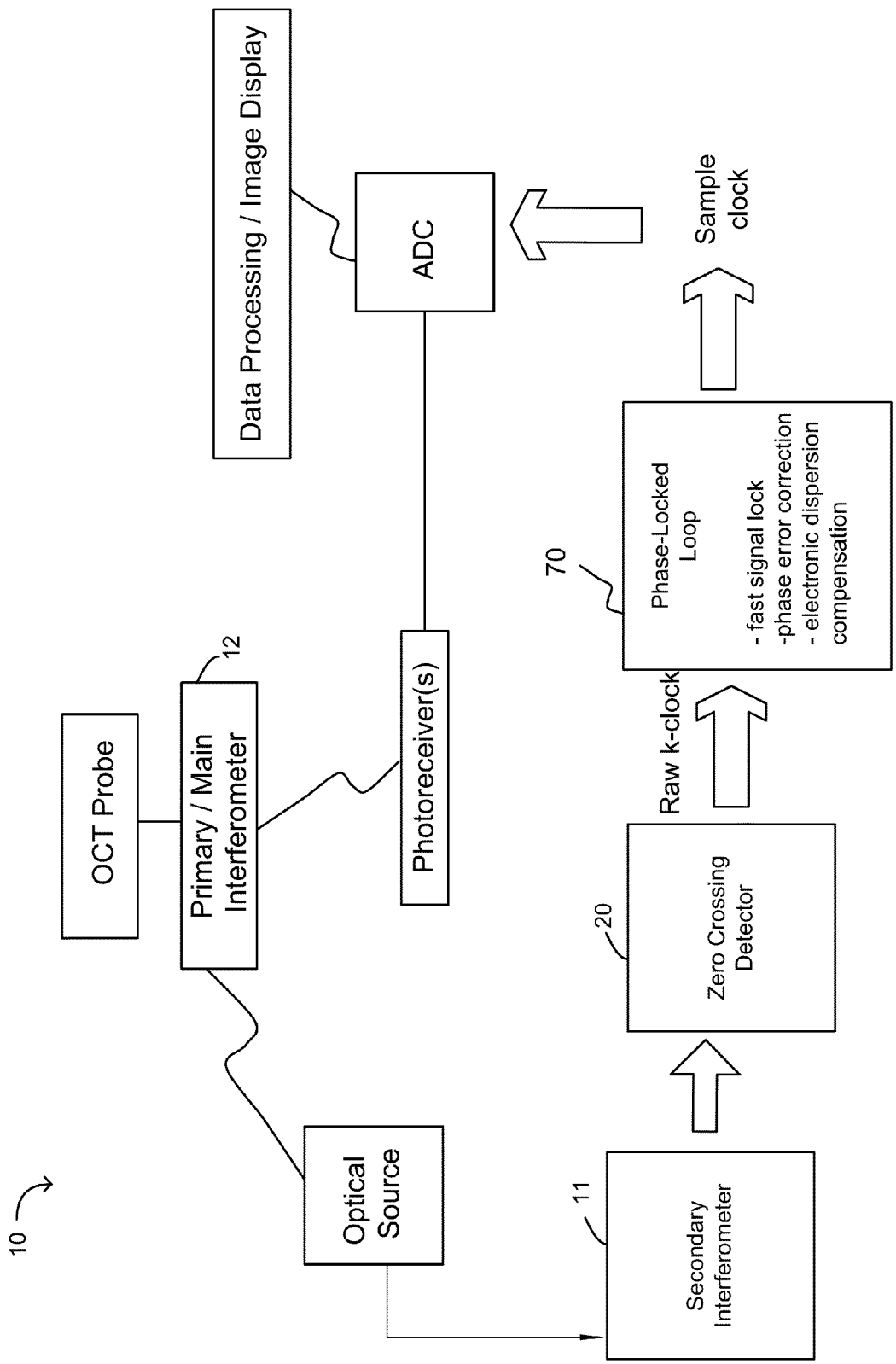
FIG. 1B shows an optical source and related optical and electronic stages of an OCT system that generate an input signal suitable for use as an input signal for the exemplary PLL shown in accordance with an illustrative embodiment of the invention.

FIG. 1A shows a system 5 configured to generate a sample clock suitable for triggering data sampling in an OCT system. Subject to the additional details below, the system 5 processes a k-clock signal using a phase-locked loop to generate a sample clock signal. An exemplary OCT system 10 is shown in FIG. 1B. As shown in FIG. 1A, the components of the system 5 also provide a frequency multiplying function with respect to an input signal 15. As shown, an input signal 15 is received by a zero-crossing detector 20. In FIG. 1B, the OCT system 10 includes a main interferometer 12 and a secondary interferometer 11 as shown in optical or electronic communication with the various other elements and subsystems depicted. In one embodiment, the input signal 15 in FIG. 1A is received from a secondary interferometer 11 as shown in FIG. 1B.

With respect to the system 5, in one embodiment a photoreceiver converts an optical signal from the secondary interferometer 11 of system 10 to an electrical signal which is then received by a zero crossing detector 20. The signal exiting the zero crossing detector 20 is the raw k-clock signal. The raw k-clock signal 22 has a frequency $f_0$, which equals the frequency of a sinusoidal fringe signal produced by the secondary interferometer 11.

Once generated or derived from an input signal 15, the raw k-clock signal 22 enters a phase-locked loop 30. Initially, the signal is received by phase detector 35. The phase detector 35 generates a bipolar current proportional to the difference between the phase of the raw k-clock signal and the phase of the output of the voltage-controlled oscillator (VCO) 55 after frequency division occurs at the divide-by-N circuit element 60. The phase error signal is converted to a voltage at Node A of the loop filter 40. Node A is the control input of the VCO. Additional details relating to the loop filter 40 are discussed below. Node A and Node B are connected and thus are at the same voltage level. The loop filter 40 determines the temporal response of the change in frequency of the VCO 55.

In one embodiment, the output of the phase detector 35 controls the VCO 55 such that it tracks the changes in the phase of the input raw k-clock signal 22. As noted below, the VCO 55 is configured to track signals, but in one embodiment, actual signal locking does not occur. The phases of raw k-clock signal 22 and divided VCO pulse train should be substantially the same on average, but may deviate slightly during rapid changes of the frequency of the k-clock.

The VCO 55 is configured to multiply the frequency of an input signal by N, wherein N is a non-zero positive integer. The multiplied signal is in phase with the input (k-clock), but the VCO oscillates through an integral number more cycles per unit time. In a preferred embodiment, N ranges from about 1 to about 16 when the PLL is used in an OCT system. N is chosen according to the coherence length of the swept light source and the desired degree of oversampling of the OCT interference signal for a given OCT scanning range. As shown, the resultant frequency-multiplied signal serves as the sample clock 65. This sample clock signal 65 is used to clock an ADC to sample interference data from a main or primary interferometer having a sample arm in optical communication with a probe and a reference arm (not shown) as shown in FIG. 1B.

In turn, the frequency of the sample clock signal 65 is transformed back to the frequency of the k-clock by the divide-by-N circuit element 60. Following frequency division, the resultant signal is applied to the phase detector 35 at the Reference input (Ref in, as shown). The phase detector 35 compares the phases of the Reference input signal and the raw k-clock signal 22 to generate a phase error signal that adjusts the frequency of the VCO 55, as part of a feedback loop. This causes the raw k-clock 22 which is correlated with the time varying frequency of an optical source and the sample clock to remain in phase.

The loop filter 40 is configured to filter and otherwise modify the phase error signal received at Nodes A and B such that both slow and fast changes in the optical frequency are tracked. Unlike conventional PLL loop filters used in crystal oscillators and telecommunication devices, the loop filter 40 is configured to have a very fast response time on the order of about 5 to about 40 k-clock periods. As an example, for certain OCT applications, the k-clock period ranges from about 2 to about 20 ns. In one embodiment, the loop filter 40 has a Node A disposed between the output of the phase detector 35 and the VCO 55. A first resistor R1 is in series with a capacitor C1, which is in electrical communication with ground. R1 and C1 set the loop bandwidth of the PLL 30. A second capacitor C2, connected from Node B to ground, reduces the amplitudes of feedthrough noise at the k-clock frequency, which produces high-frequency sidelobes or local maxima in the tracking response of the VCO 55. A second resistor R2 is in electrical communication at the junction of resistor R1 and capacitor C1. Resistor R2 is in electrical communication with two diodes D1 and D2. The first diode D1 and the second diode D2 are shown in a loop configuration with a reference voltage Vref. The Vref can be a suitable reference control signal such as a fixed voltage, a PLL-generated signal, an analog signal, and other suitable signals as discussed below. Values for R1, R2, D1, D2, and C1 can be determined upon inspection or RC circuit calculations depending on the laser scanning speed, multiplication factor N, and the type of PLL selected. In one embodiment, R1 and R2 range from about 0.5 kΩ to about 10 kΩ. Further in one embodiment, C1 and C2 are less than about 100 pF. In one embodiment, the time constant of the loop filter, $\tau=(R1)(C1)$ ranges from about 20 ns to about 80 ns for a VCO range of about 100 MHz to about 250 MHz with N=4. The diode pair D1 and D2 provides a current cutoff and allow a boost current as described below in one embodiment.

In one embodiment, the first diode D1 and the second diode D2 are Schottky diodes. These diodes can be selected to have a fast response in one embodiment. These two Schottky diodes are reverse biased and are connected to a node that receives a reference voltage Vref, such as from a reference control signal, to preset the voltage level of the loop filter 40.

Specifically, in one embodiment, the system of FIG. 1A shows a filter 40 that uses the pair of diodes connected to a reference voltage Vref to boost current during the start-up and release phases of the VCO tracking cycle when the input frequency varies rapidly. In one embodiment, Vref is set approximately 0.25 volts below the VCO voltage that produces an output frequency equal to N times the mean frequency of k-clock, $f_{mean}$. The boost current is cut off or blocked automatically by the diodes D1, D2 during a particular frequency state. In one embodiment, the frequency state occurs during the period when the frequency of the k-clock is within a band centered on $f_{mean}$ where precise tracking is required. In one embodiment, the mean frequency of k-clock, $f_{mean}$ ranges from about 80 MHz to about 125 MHz.

FIG. 1B depicts a system 10 that includes a generalized PLL embodiment 70 that can use one or more of the PLLs described herein. In this embodiment, a sample clock is used to control the data acquisition performed by the analog to digital converter that is in electrical communication with the photoreceiver(s) in optical communication with a main interferometer 12. The main interferometer is in optical communication with an OCT probe such as an optical fiber-based probe configured to rotate and be disposed in a lumen of interest. The ADC transmits the data obtained as a result of it being clocked with the sample clock from the PLL 70 to a data processing and/or image display system. The data processing and image display system allow for the data obtained using the probe to be displayed to an end user such as a doctor or clinician.

Figure 2:
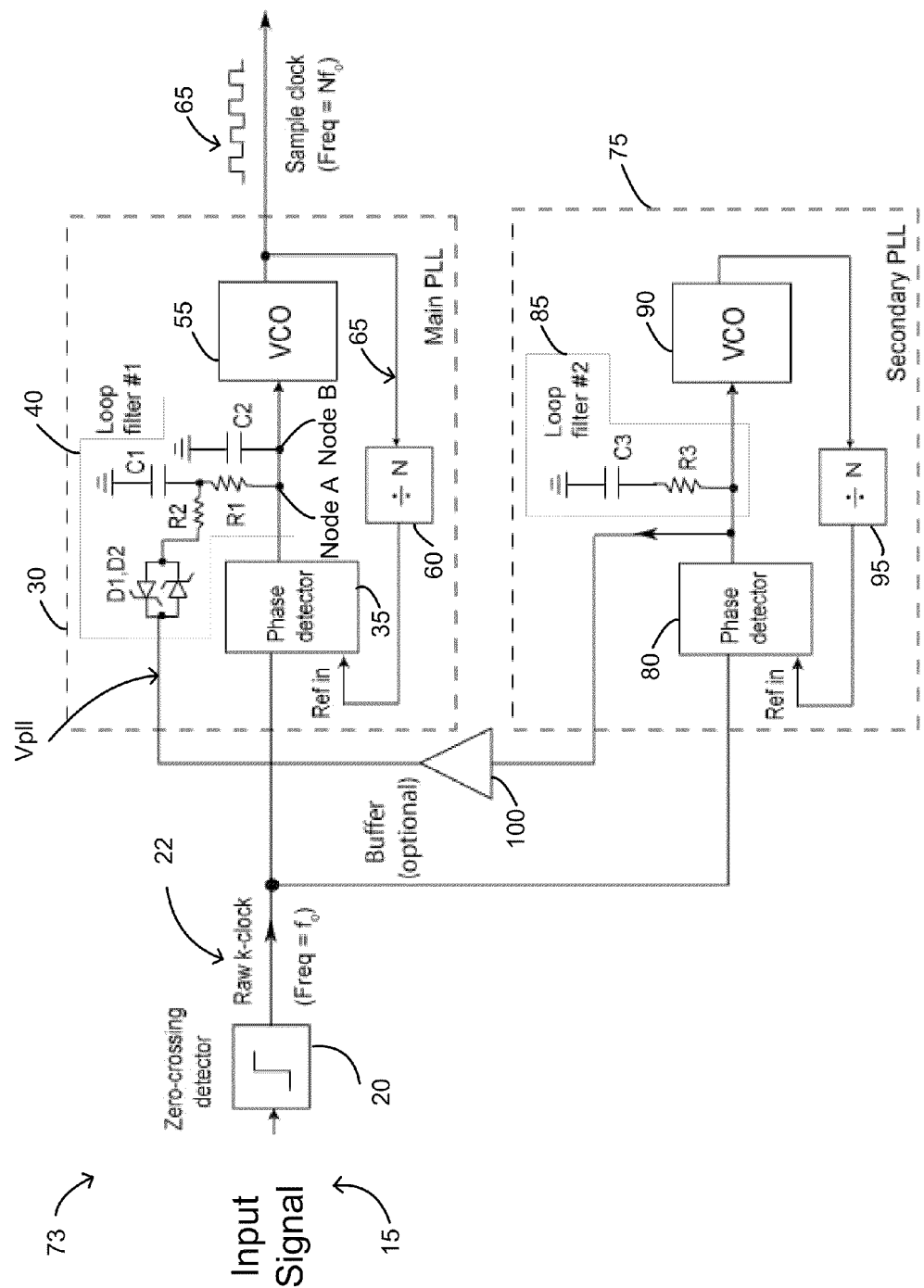
FIG. 2 shows a dual phase-locked loop-based system configured to generate a clock signal suitable for use in an OCT system in accordance with an illustrative embodiment of the invention.

FIG. 2 shows a system 73 in which the PLL 30 shown in the top portion of FIG. 2 is the same PLL 30 shown in FIG. 1A. However, instead of the Vref signal shown in FIG. 1A, the system 73 of FIG. 2 includes a second phase-locked loop 75 that provides the Vpll voltage as a fast locking loop filter reference voltage.

This second PLL 75 includes a phase detector 80, a loop filter 85, a voltage controlled oscillator 90, and a divide by N circuit element 95 that are in electrical communication with each other as shown. A Reference input (Ref in) to the second PLL 75 is supplied by the divide by N circuit element 95 as a feedback or control signal to the phase detector 80. The reference signals received by the two phase detectors 35, 80 can be substantially the same or different. A signal line is shown in electrical communication with a buffer 100 that transmits a reference voltage signal Vpll from the second PLL 75 to the first loop filter 40. In one embodiment, the buffer 100 is a unity-gain amplifier.

The optional buffer 100 can be configured to isolate the loop-filter voltages of the secondary PLL 75 from those of the main PLL 30, while providing additional current sourcing capability. The second PLL 75 provides a Vpll to set the frequency of VCO 55 close to a desired set point during the start-up and release phases of the VCO tracking cycle. This tracking cycle refers to when the VCO attempts to lock on the raw k-clock or a signal derived therefrom. The VCO frequency is set quickly. For example, in one embodiment the second PLL 75 sets the VCO frequency between about 100 and about 250 MHz with N=4. The first PLL 30 then finely tunes the VCO frequency to lock the phases of the input and output clocks.

As shown, the loop filter 85 in the second PLL includes a single low pass filter with a time constant that is significantly shorter than (2-4 times shorter) than that of the first loop filter 40. Specifically, the second loop filter 85 is shown as an RC circuit connected to ground having a capacitor C3 and a resistor R3. In one embodiment, the time constant of the second loop filter 85, $\tau=(C3)(R3)$ ranges from about 10 to about 40 ns for a VCO range of about 50 to about 250 MHz with N=4.

Noise Suppression Embodiments and Related Features

Given the complexity of OCT data collection and processing systems, there are numerous sources for noise and unwanted data artifacts. For example, digital noise generated by a clock signal can be fed through to the ADC performing the OCT data collection. This example of a type of digital feedthrough noise can cause errors. These errors can appear as line spectra or spurs in the frequency domain. Spurs cause noise that appears as one or more lines in an OCT image. An exemplary system for reducing feedthrough noise is shown in FIG. 3.

Figure 3:
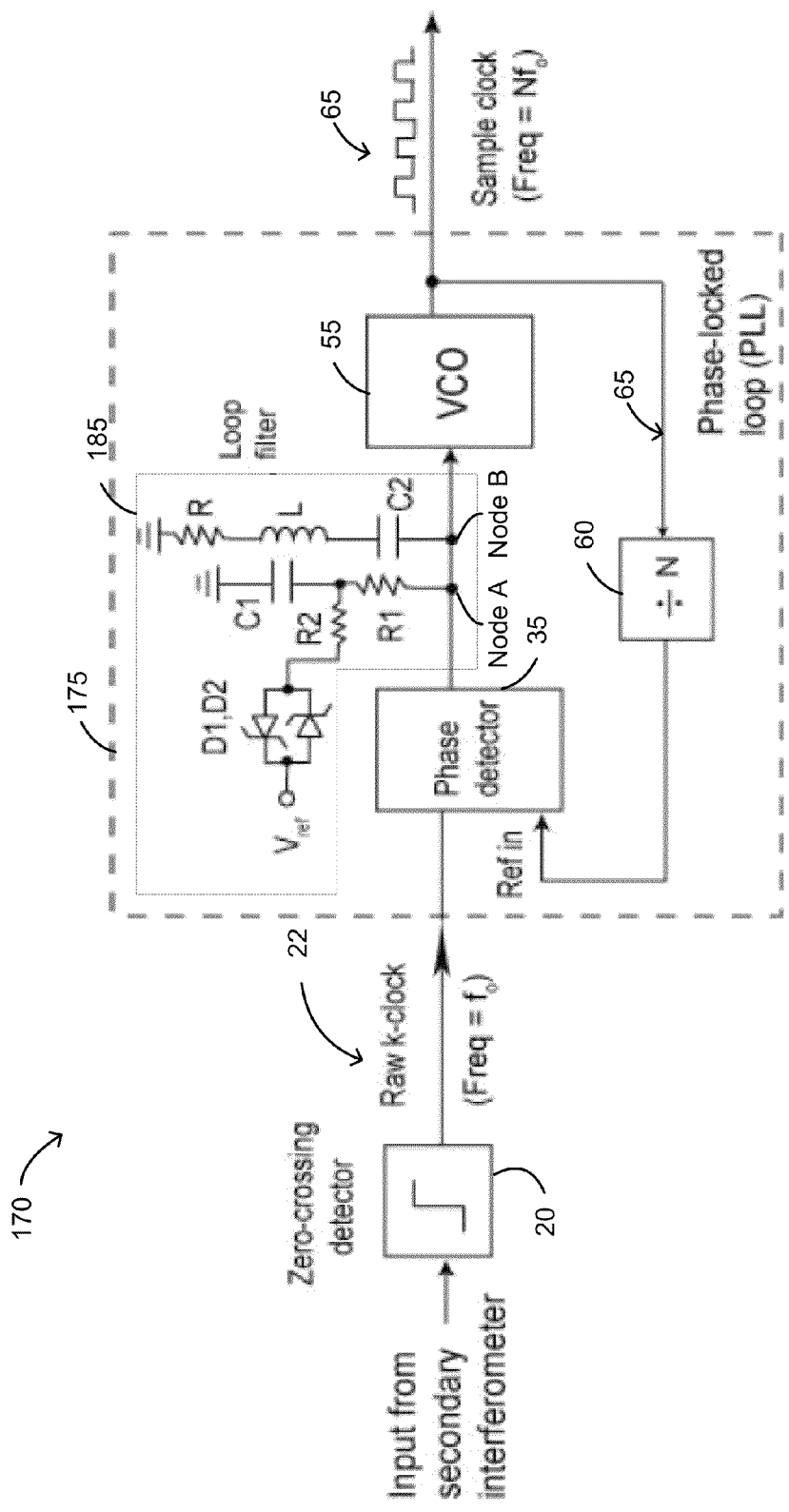
FIG. 3 shows a phase-locked loop-based system configured to generate a clock signal suitable for use in an OCT system and compensate for feedthrough error in accordance with an illustrative embodiment of the invention.

In FIG. 3, a system 170 is shown that includes a phase-locked loop 175 that includes a phase detector 35, a loop filter 185, a VCO 55, and a divide-by-N circuit element 60 in electrical communication with each other as shown. The operation of the system 170 is similar to PLL 30 of FIG. 1A. The electrical elements of the loop filter 185 in electrical communication with Node A are the same in FIG. 1A and FIG. 3, except an additional inductor L and resistor R are placed in series with capacitor C2. In FIG. 3, L, C2 and R are connected in series to form a resonant notch filter tuned or configured to suppress spurs at the input frequency $f_0$ while maintaining fast locking capabilities to the raw k-clock signal 22. In one embodiment, the resonant frequency $1/[2\pi(LC)^{0.5}]$ ranges from about 20 to about 100 MHz with a quality factor, $Q=2\pi f_0 L/R$, between about 2 and about 5.

Digital Controller Embodiments

Figure 4:
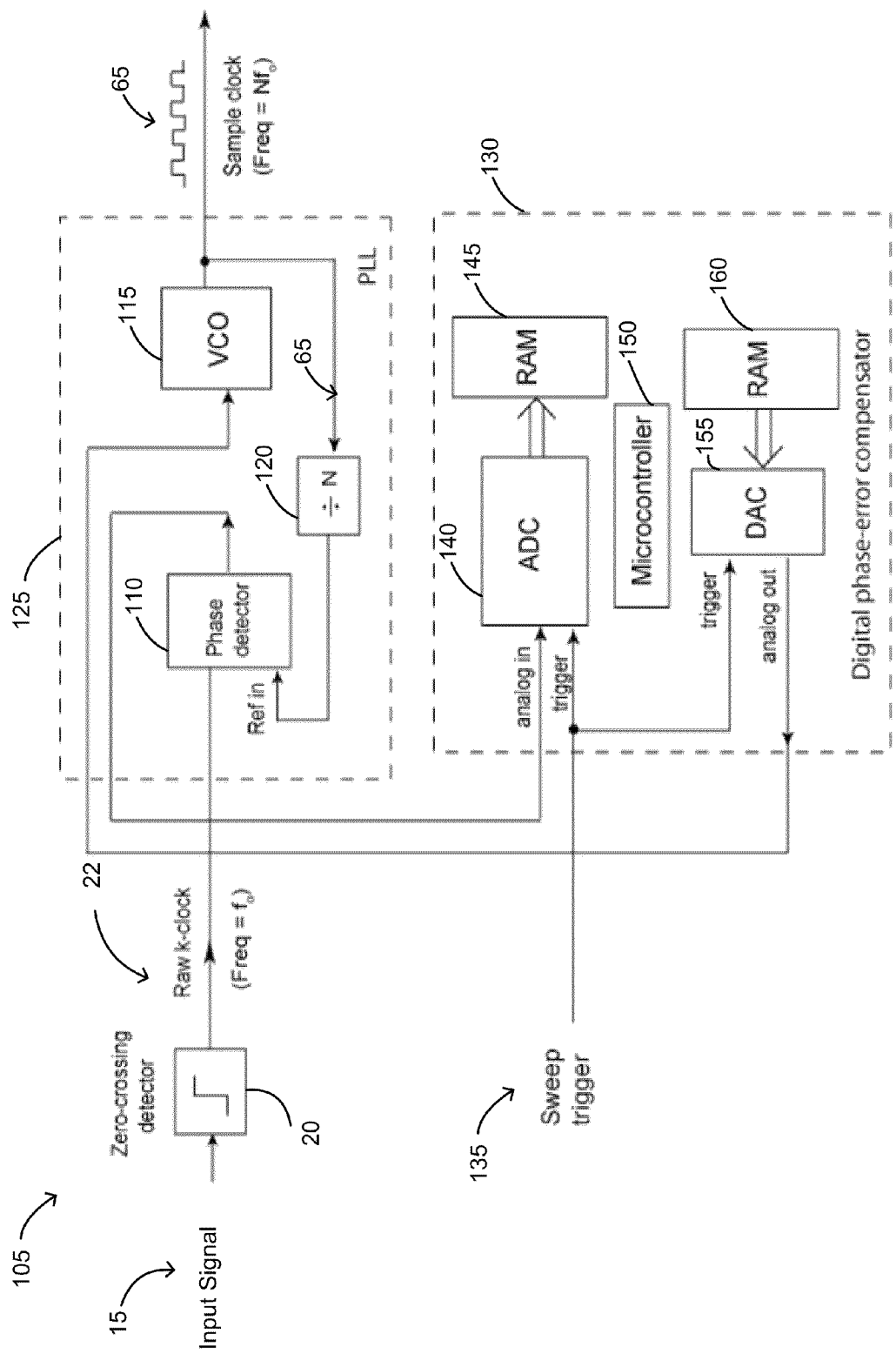
FIG. 4 shows a phase-locked loop-based system configured to generate a clock signal suitable for use in an OCT system that includes a phase-error compensator in accordance with an illustrative embodiment of the invention.

FIG. 4 shows another embodiment of a PLL clocking system 105 that includes a phase-locked loop 125 that includes a phase detector 110, a VCO 115 and a divide-by-N circuit element 120 that are in electrical communication with each other and a zero-crossing detector 20 as shown. This system is similar to the PLL 30 of FIG. 1A, but differs in that instead of the loop filter 40, a control circuit 130 is in electrical communication with the VCO 115. In general, in this system 105 a phase-error compensator, such as the example shown as control circuit 130 is configured to adjust the VCO frequency based on the phase error obtained or stored during the preceding sweeps of the optical source, such as a swept laser. This helps synchronize the optical source and the ADC used to sample OCT data as shown in FIG. 1B.

With respect to FIG. 4, the control circuit shown 130 can generally be implemented using one or more different digital phase-error compensator circuits or systems. The control circuit 130 is configured to respond to a sweep trigger signal 135. This sweep trigger is the control signal used to cause a swept optical source to start sweeping over a range of frequencies or wavelengths such as shown in FIG. 1B. By averaging phase detector signals having unwanted noise components, this configuration advantageously reduces sensitivity to noise at fast tracking speeds. Consequently, compared to the analog methods, the locking or tracking time of the PLL 175 can be reduced without as severe of a penalty in tracking accuracy.

As shown in FIG. 4, the control circuit 130 is a digital control circuit that includes an ADC 140 in electrical communication with a first memory 145 shown as random access memory. A second memory 160 is also shown as random access memory. In general, the control circuit 130 is configured as a digital compensator that corrects phase errors measured on preceding sweeps of the optical source used in a swept source OCT system. Typically between about 2 and about 10 of the preceding sweeps are stored in memory 145 and averaged to obtain the noise-reduced VCO input voltage. The ADC 140 has at least two inputs wherein one is an analog signal input from phase detector 35 and the other is a sweep trigger or trigger input from used with the optical source.

As shown, a microcontroller 150 can also be used in the control circuit 130 and is in electrical communication with the ADC 140, DAC 155 and RAM 145, 160. The microcontroller can be connected to other components through its output and inputs as appropriate for a given configuration. The microcontroller transfers arrays of digitized phase detector signals into one or both of the first and second memories 145, 160, calculates averages of stored arrays, and performs digital filtering operations for loop compensation. A digital to analog converter (DAC) 155 has a trigger signal input and an analog signal output as shown. The first memory 145 and the second memory 160 are configured to store the raw and processed data arrays. The DAC and ADC referenced herein can generally be referred to as signal converters.

Electronic Dispersion Compensation Embodiments and Related Features

Figure 5:
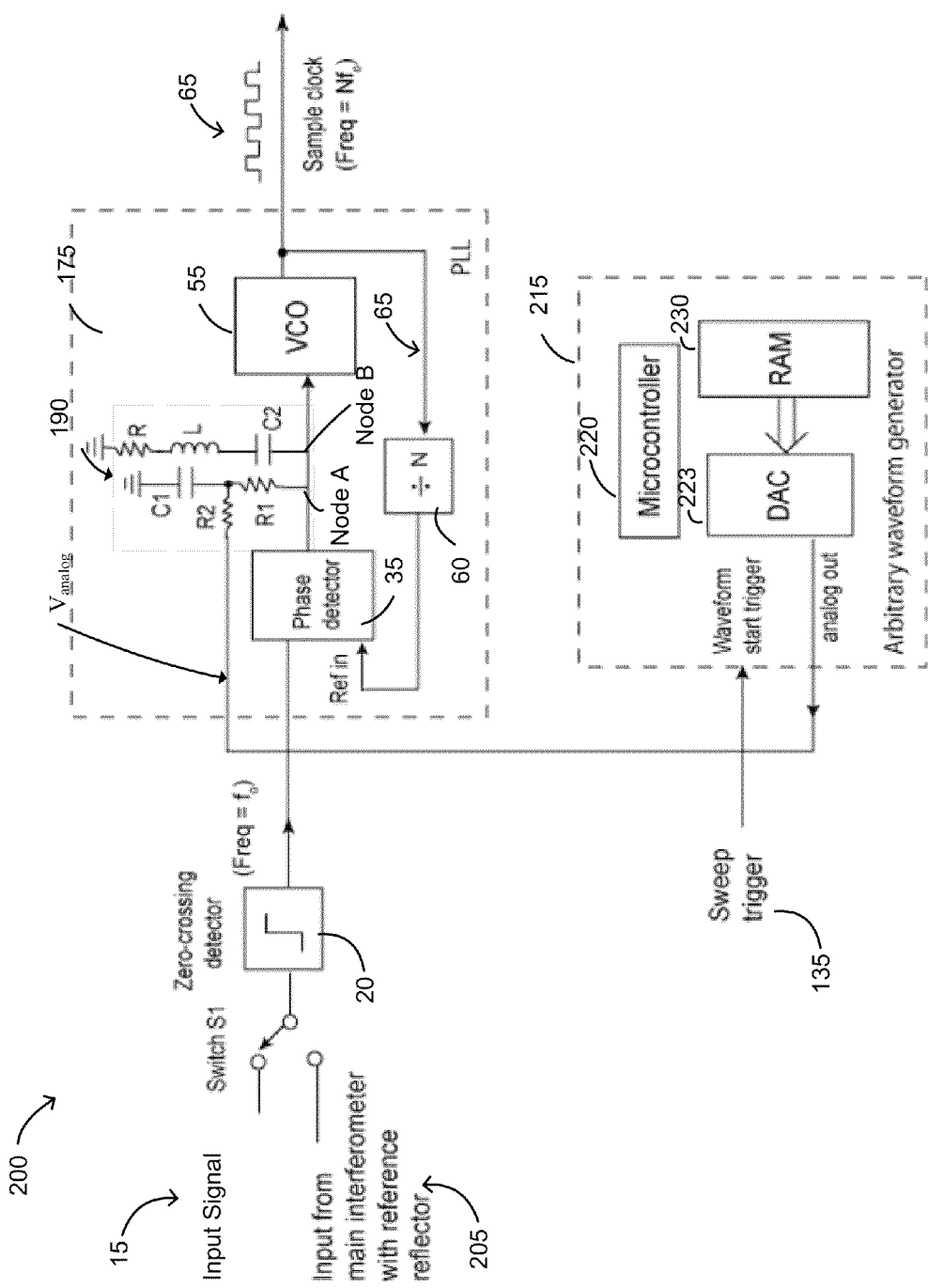
FIG. 5 shows a phase-locked loop-based system configured to generate a clock signal suitable for use in an OCT system and compensate for dispersion effects in accordance with an illustrative embodiment of the invention.

Optical coherent tomography signals, such as signals obtained relative to a lumen or other sample of interest using a probe that transmits light and collects light scattered from a sample are subject to various signal degrading effects such as dispersion. Dispersion can result from the lengths of optical fiber used to form various optical paths and from other optical components of the system. FIG. 5 shows a system 200 that uses a PLL and other features to reduce unwanted dispersion effects using one or more electronic dispersion compensation elements.

Specifically, FIG. 5 shows a PLL-based system 200 configured to adjust the instantaneous frequency of the sample clock 65 to minimize or reduce the difference in phase between the edges of the k-clock and a clock generated from the zero crossings of a signal derived from a reference reflector in the sample arm of the main interferometer. For additional, details relating to a reference reflector, various exemplary embodiments are described in U.S. Pat. No. 7,813,609 and U.S. Publication No. 2011-0007315, the disclosures of both of which are herein incorporated by reference in their entirety.

As shown in FIG. 5, the system 200 includes a switch S1 configured to select between an input signal 15 and a signal from the main interferometer in an OCT system that includes a reference reflector 205. The switch S1 is used to perform signal calibration with respect to $V_{analog}$ as describe below. As discussed above, signal 15 can be generated by a secondary interferometer in optical communication with the optical source of the OCT system. A zero crossing detector 20 is also in electrical communication with a phased-locked loop 175 as shown. This PLL 175 has the same configuration as shown in FIG. 3 except that instead of a reference voltage Vref, an analog signal $V_{analog}$ from the waveform generator 215 is applied to the loop filter 190 as shown. The loop filter 190 does not include a diode pair in the embodiment shown. Various arbitrary waveform generators can be used. The waveform generator 215 can include a waveform start trigger input 135 and a $V_{analog}$ output and a microcontroller 220, a digital to analog converter 223 to produce the analog voltage from data in a memory element 230 as shown. Each element of the waveform generator 215 can be in electrical communication with one or more of the other elements shown as constituting the waveform generator 215.

To compensate for the phase error, the small modulation voltage $V_{analog}$ from the arbitrary waveform generator 215 is superimposed on the phase error signal Reference input at the input of the VCO 55. The shape and amplitude of this modulation voltage $V_{analog}$ is either set once at the time of factory calibration or updated continuously according to a re-calibration process initiated by connecting the input to a reference signal from the main interferometer via switch S1. Given that the reference reflector is positioned at a known distance along each axial scan line and doped with a scattering material to create a recognizable signal, this information can be used to perform phase calibration.

Characteristics and Parameters of Exemplary PLL Embodiments

In one embodiment, the PLLs described herein in various embodiments are implemented using one or more circuit elements or as an integrated circuit such as a chip having a plurality of electrical contacts, leads, conductors, connections or ports and other mechanisms for receiving or sending signals all of which are alternatively referred to herein, without limitation, as inputs and/or outputs. In one embodiment, various parameters of the integrated circuit or a circuit element are modified to tune or otherwise configure the operational characteristics of the PLL. Specifically, some of these characteristics can include or relate to the VCO bandwidth, the VCO response and the maximum frequency limit or range of the PLL.

For example, in one embodiment the PLL includes a VCO and the VCO bandwidth is selected or configured to be very wide to accommodate the non-linear optical-frequency sweeps of a variety of tunable OCT light sources. In one embodiment, the VCO frequency ranges from about 50 MHz to about 250 MHz and in another embodiment the VCO bandwidth ranges from 100 to 500 MHz. In most embodiments, the VCO bandwidth has a high frequency to low frequency ratio that is greater than or equal to 2:1. In one embodiment, the PLL can be used over a wider band than the locking range or tracking range specified by the manufacturer for conventional applications in which a loop filter with a long time constant is used. With respect to the VCO response, this response is selected or configured to be very fast. In one embodiment, the VCO response refers to the time period it takes for the VCO to respond to a sudden change in frequency of the input signal.

For example, the VCO response is less than or equal to about 100 nanoseconds in one embodiment. In one embodiment, the PLL selected for use in a given OCT system is configured to rapidly clock an ADC receiving interferometric signals correlated with a sample that receives light and scatters light using an OCT probe. Further, in one embodiment the phase-locked loop is configured such that start up occurs in about 50 to about 200 ns. In the various embodiments of the PLL system, a complete locking state is not maintained at all times during start-up, but instead the phase trajectory of the VCO interpolates over a range of frequencies to provide sufficient synchronization between the k-clock and signals generated by the main interferometer.

Experimental Results and Data

Figure 6:
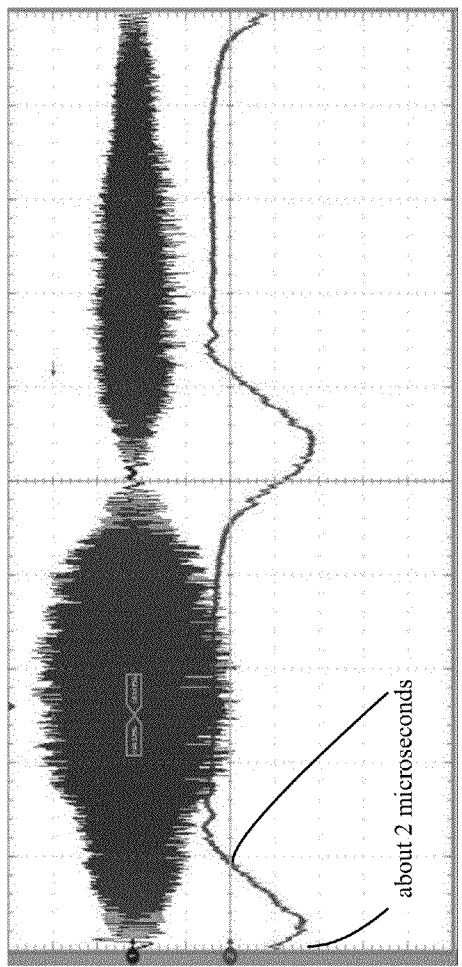
FIG. 6 shows a plot of two signal traces without the Vref signal turned on in accordance with an illustrative embodiment of the invention.
Figure 7:
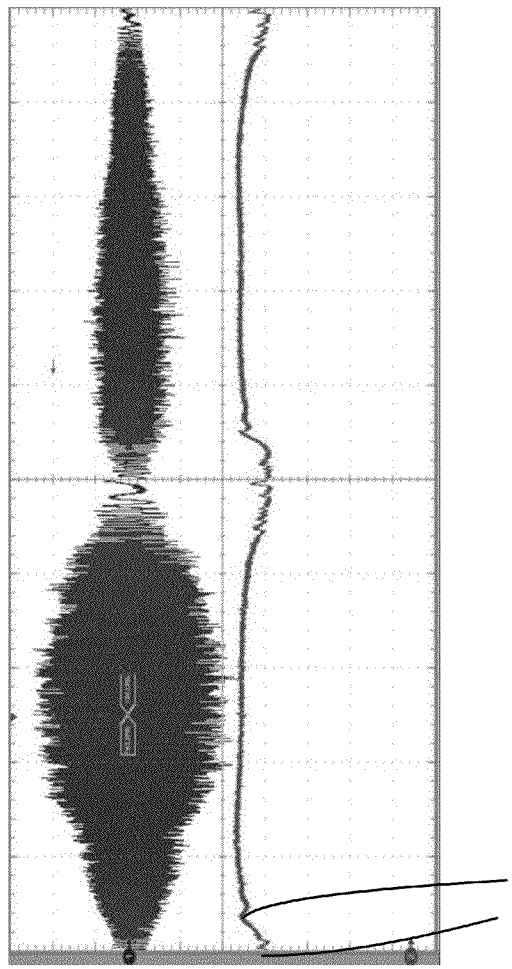
FIG. 7 shows a plot of two signal traces with the Vref signal turned on in accordance with an illustrative embodiment of the invention.

FIGS. 6 and 7 illustrate the reduction in locking time attained by adding a reference voltage Vref to the loop filter through the diodes D1, D2 used in the system shown in FIG. 1A. Specifically, FIG. 6 shows a top trace and a bottom trace in a system without a loop filter preset voltage. The top trace is input from secondary laser interferometer and corresponds to an example of signal 15 in the embodiments shown. In turn, the bottom trace shows a phase error voltage, such as signal 43 in FIG. 1A, at the input to a VCO in a PLL. As shown, the phase error signal stabilizes in about 2 microseconds.

In contrast, as shown in FIG. 7, a filter preset voltage is used in the PLL-based system embodiment. The top trace is input from secondary laser interferometer, such as signal 15, and the bottom trace is a phase error voltage, such as signal 43 in FIG. 1A, at input to a VCO. As shown, with a filter preset voltage, the phase error stabilizes in about 0.8 microseconds.

In addition, the reduction of feedthrough noise that occurs through the application of RLC filtering as shown in FIG. 3 is demonstrated by comparing FIGS. 8 and 9. In FIG. 8, no feedthrough suppression is implemented. Feedthrough noise ('spurs') appear as narrow, small amplitude side lobes in the lower trace, which shows the logarithmic OCT signal from a single reflector. In contrast, in FIG. 9, feedthrough suppression has been implemented. As shown, a significant reduction of the amplitude of the spurs is apparent relative to of the amplitude of the spurs in FIG. 8.

In the description, the invention is discussed in the context of optical coherence tomography and inteferometric signals; however, these embodiments are not intended to be limiting and those skilled in the art will appreciate that the invention can also be used for other signal clocking systems, methods, and devices.

In the description, the invention is discussed in the context of optical coherence tomography; however, these embodiments are not intended to be limiting and those skilled in the art will appreciate that the invention can also be used for other imaging and diagnostic modalities or optical systems in general.

The terms light and electromagnetic radiation are used interchangeably herein such that each term includes all wavelength (and frequency) ranges and individual wavelengths (and frequencies) in the electromagnetic spectrum. Similarly, the terms device and apparatus are also used interchangeably. In part, embodiments of the invention relate to or include, without limitation: sources of electromagnetic radiation and components thereof; systems, subsystems, and apparatuses that include such sources; mechanical, optical, electrical and other suitable devices that can be used as part of or in communication with the foregoing; and methods relating to each of the forgoing. Accordingly, a source of electromagnetic radiation can include any apparatus, matter, system, or combination of devices that emits, re-emits, transmits, radiates or otherwise generates light of one or more wavelengths or frequencies.

One example of a source of electromagnetic radiation is a laser. A laser is a device or system that produces or amplifies light by the process of stimulated emission of radiation. Although the types and variations in laser design are too extensive to recite and continue to evolve, some non-limiting examples of lasers suitable for use in embodiments of the invention can include tunable lasers (sometimes referred to as swept source lasers), superluminescent diodes, laser diodes, semiconductor lasers, mode-locked lasers, gas lasers, fiber lasers, solid-state lasers, waveguide lasers, laser amplifiers (sometimes referred to as optical amplifiers), laser oscillators, and amplified spontaneous emission lasers (sometimes referred to as mirrorless lasers or superradiant lasers).

The aspects, embodiments, features, and examples of the invention are to be considered illustrative in all respects and are not intended to limit the invention, the scope of which is defined only by the claims. Other embodiments, modifications, and usages will be apparent to those skilled in the art without departing from the spirit and scope of the claimed invention.

The use of headings and sections in the application is not meant to limit the invention; each section can apply to any aspect, embodiment, or feature of the invention.

Throughout the application, where compositions are described as having, including, or comprising specific components, or where processes are described as having, including or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes," "including," "have," "has," or "having" should be generally understood as open-ended and non-limiting unless specifically stated otherwise.

The use of the singular herein includes the plural (and vice versa) unless specifically stated otherwise. Moreover, the singular forms "a," "an," and "the" include plural forms unless the context clearly dictates otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

Where a range or list of values is provided, each intervening value between the upper and lower limits of that range or list of values is individually contemplated and is encompassed within the invention as if each value were specifically enumerated herein. In addition, smaller ranges between and including the upper and lower limits of a given range are contemplated and encompassed within the invention. The listing of exemplary values or ranges is not a disclaimer of other values or ranges between and including the upper and lower limits of a given range.

It is to be understood that the figures and descriptions of the invention have been simplified to illustrate elements that are relevant for a clear understanding of the invention, while eliminating, for purposes of clarity, other elements. Those of ordinary skill in the art will recognize, however, that these and other elements may be desirable. However, because such elements are well known in the art, and because they do not facilitate a better understanding of the invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the invention, a single component may be replaced by multiple components, and multiple components may be replaced by a single component, to provide an element or structure or to perform a given function or functions. Except where such substitution would not be operative to practice certain embodiments of the invention, such substitution is considered within the scope of the invention.

The examples presented herein are intended to illustrate potential and specific implementations of the invention. It can be appreciated that the examples are intended primarily for purposes of illustrative of the invention for those skilled in the art. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the claims.

What is claimed is:

1. An optical coherence tomography system comprising:
a control system comprising
a zero-crossing detector having a first input and a first output, the first input configured to receive a first input signal; and
a first phased-locked loop circuit having a second input and a second output wherein the second input is in electrical communication with the first output, the circuit comprising:
a phase detector in electrical communication with the second input,
a loop filter in electrical communication with the phase detector, the loop filter comprising a reference signal input configured to receive a reference control signal, and
a voltage controlled oscillator in electrical communication with the loop filter and the second output, the phase-locked loop circuit configured to generate a sample clock; and
an analog to digital converter having a sample clock input, an interferometric signal input, and a sample data output, the analog to digital converter configured to receive the sample clock and sample OCT data in response thereto.

2. The optical coherence tomography system of claim 1 wherein the phased-locked loop circuit is configured to lock on a first signal received at the second input in less than or equal to about 1 microseconds.

3. The optical coherence tomography system of claim 1 wherein the first input signal has a frequency and a mean frequency and wherein the loop filter comprises a first diode and a second diode configured to automatically block current flow during a first frequency state.

4. The optical coherence tomography system of claim 1 wherein the voltage controlled oscillator is configured to have a bandwidth that ranges from a high frequency to a low frequency such that the ratio of the high frequency to the low frequency is greater than or equal to about 2:1.

5. The optical coherence tomography system of claim 1 wherein the phase-locked loop is configured such that it can transmit or lock on frequencies greater than or equal to about 20 MHz.

6. The optical coherence tomography system of claim 1 wherein the voltage controlled oscillator is configured to have a response time less than about 100 nanoseconds.

7. The optical coherence tomography system of claim 3 wherein the first frequency state is when the frequency is within a specified band of frequencies centered on the mean frequency.

8. The optical coherence tomography system of claim 1 wherein the loop filter comprises a RC circuit or a RLC circuit in electrical communication with ground.

9. The optical coherence tomography system of claim 1 further comprising a second phase locked loop configured to generate the reference control signal.

10. The optical coherence tomography system of claim 8 wherein the loop filter has a time constant that ranges from about 20 ns to about 80 ns.

11. The optical coherence tomography system of claim 1 wherein the phase-locked loop is configured to multiply the input signal N times wherein N is a positive integer that ranges from 1 to 16.

12. An optical coherence tomography system comprising:
a control system comprising:
a zero-crossing detector having a first input and a first output, the first input configured to receive a first input signal; and
a phased-locked loop circuit having a second input and a second output wherein the second input is in electrical communication with the first output, the circuit comprising
a phase detector in electrical communication with the second input, the phase detector comprising a reference input and a phase error signal output,
a phase error compensator in electrical communication with the phase error signal output and comprising a phase error compensator output and a sweep trigger signal input, and
a voltage controlled oscillator in electrical communication with the phase error compensator output and the second output, the voltage controlled oscillator having a VCO frequency, the phase-locked loop circuit configured to generate a sample clock, and
an analog to digital converter having a sample clock input, an interferometric signal input, and a sample data output, the analog to digital converter configured to receive the sample clock and sample OCT data in response thereto.

13. The optical coherence tomography system of claim 12 wherein the phase error compensator is configured to adjust the VCO frequency based on a phase error in a sweep trigger input signal.

14. A method of clocking an analog to digital converter configured to sample optical coherence data from a main interferometer in an optical coherence tomography system comprising:
receiving a first clock signal having a first phase at a first input to a phase-locked loop;
locking on the first clock signal within a first time period;
detecting the first phase of the first clock signal;
frequency multiplying the first clock signal or a signal derived therefrom by N using an oscillator to generate a sample clock; and
clocking an analog to digital converter in electrical communication with a photoreceiver in optical communication with an interferometer configured to collect OCT data.

15. The method of claim 14 wherein the first time period is less than or equal to about 1 microseconds.

16. The method of claim 14 further comprising the steps of filtering the first clock signal using a loop filter having a control signal input.

17. The method of claim 14 further comprising the step of presetting a reference voltage level of the loop filter by applying a control signal to the control signal input.

18. The method of claim 17 further comprising the step of varying the control signal in response to a sweep trigger signal, a phase-locked loop originated signal, or a signal correlated with one of the two foregoing signals.

19. The method of claim 14 further comprising the step of compensating for feedthrough noise by filtering the first clock signal using a loop filter comprising a RLC or RC circuit.

20. The method of claim 14 further comprising the step of compensating for phase error prior to generating the sample clock by controlling the oscillator using a control signal correlated with a sweep trigger signal of an optical source used in the OCT system.

* * * * *